United States Patent
Taracila et al.

(10) Patent No.: US 8,427,159 B2
(45) Date of Patent: Apr. 23, 2013

(54) QUARTER WAVE BALUN FOR MAGNETIC RESONANCE IMAGING SYSTEMS

(75) Inventors: Victor Taracila, Orange Village, OH (US); Fraser Robb, Aurora, OH (US); Aleksey Zemskov, Solon, OH (US); Vijayanand Alagappan, Streetsboro, OH (US)

(73) Assignee: General Electric Company, Schenectady, NY (US)

( * ) Notice: Subject to any disclaimer, the term of this patent is extended or adjusted under 35 U.S.C. 154(b) by 452 days.

(21) Appl. No.: 12/772,753

(22) Filed: May 3, 2010

(65) Prior Publication Data

US 2011/0267061 A1 Nov. 3, 2011

(51) Int. Cl.
*G01V 3/00* (2006.01)
(52) U.S. Cl.
USPC .......................................................... 324/318
(58) Field of Classification Search ........... 324/300–322
See application file for complete search history.

(56) References Cited

U.S. PATENT DOCUMENTS

| | | |
|---|---|---|
| 4,859,950 A | 8/1989 | Keren |
| 6,483,415 B1 | 11/2002 | Tang |
| 6,750,652 B2 | 6/2004 | Weyers et al. |
| 7,215,121 B2 | 5/2007 | Sambandamurthy et al. |
| 7,282,915 B2 | 10/2007 | Giaquinto et al. |
| 7,498,813 B2 | 3/2009 | Giaquinto et al. |
| 7,652,476 B2 | 1/2010 | de Rooij et al. |
| 7,772,941 B2 * | 8/2010 | Yeung et al. .................. 333/26 |
| 2010/0253351 A1 * | 10/2010 | Huish et al. .................. 324/318 |

* cited by examiner

*Primary Examiner* — Dixomara Vargas
(74) *Attorney, Agent, or Firm* — The Small Patent Law Group; Dean D. Small

(57) ABSTRACT

A balun assembly includes a body portion having an opening extending therethrough, the opening sized to receive at least one radio-frequency (RF) cable therethrough, the RF cable transmitting a signal therethrough a signal having a wavelength, and a balun disposed within the body portion, the balun being folded to form a plurality of layers, the combined length of the layers being approximately equal to a quarter wavelength of the signal transmitted through the RF cable. A method of fabricating a balun assembly and an MRI system including a balun are also provided.

20 Claims, 10 Drawing Sheets

QUARTER WAVE BALUN FOR MAGNETIC RESONANCE IMAGING SYSTEMS

BACKGROUND OF THE INVENTION

The subject matter disclosed herein relates generally to balance-unbalance (balun) devices, and more particularly to a quarter-wave balun used in a medical imaging system.

Magnetic Resonance Imaging (MRI) systems include a magnet, such as a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are energized to impose a magnetic gradient to the primary magnetic field. Transmit radio-frequency (RF) coils are then pulsed to create RF magnetic field pulses in a bore of an MRI scanner to selectively excite a volume corresponding to the region of interest in order to acquire MR images of the region of interest using receive RF coils. During the transmission of the RF magnetic field pulses, the receive RF coils are decoupled. The resultant image that is generated shows the structure and function of the region of interest.

There are typically balancing problems that occur when the MRI system is operated at the relatively high frequencies, especially, when coupling balanced and unbalanced circuits, such as transmission lines, together. For example, the RF coils are generally connected to the MR system, and more particularly to an RF generator and/or an RF receiver using a coaxial cable. The coaxial cable facilitates signal transmission and protecting the MRI system from "picking-up" extraneous RF signals which are present in the environment. The conventional coaxial cable includes a braid separated from a central conductor by a plastic material. The braid acts as a shield that minimizes the pick-up of foreign frequencies by the coaxial cable. However, the braid itself may carry foreign induced currents. The induced currents may flow into the RF coil and cause inaccuracies in the measurements being taken from the RF coil.

Therefore, a balun (balance/unbalance) device is used to reduce the noise and/or stray RF currents generated due to induced currents in the co-axial cable. Specifically, the conventional balun creates a high impedance on the RF cable when the overall length of the balun is equal to one quarter of the electromagnetic radiation wavelength of the signal transmitted through the RF cable.

BRIEF DESCRIPTION OF THE INVENTION

In accordance with one embodiment, a balun assembly is provided. The balun assembly includes a body portion having an opening extending therethrough, the opening sized to receive at least one radio-frequency (RF) cable transmitting therethrough a signal having a wavelength, and a balun disposed within the body portion, the balun being folding to form a plurality of layers, the combined length of the layers being approximately equal to a quarter wavelength of a signal transmitted through the RF cable. A method of fabricating a balun assembly is also provided.

In accordance with another embodiment, a method of fabricating a balun for a Magnetic Resonance Imaging (MRI) system is provided. The MRI system having a balun. The method includes determining a length of a length of the balun based on a wavelength of a signal transmitted through the RF cable, and folding the balun into a plurality of layers such that an overall length of the balun is less than a quarter wavelength of a signal transmitted through the RF cable, the length of each layer being determined based on the quantity of layers.

In accordance with a further embodiment, an MRI imaging system is provided. The MRI imaging system includes an imaging portion, an RF cable coupled to the imaging portion, and a balun assembly circumscribing the RF cable. The balun includes a body portion having an opening extending therethrough, the opening sized to receive the RF, the RF cable transmitting therethrough a signal having a wavelength, and a balun disposed within the body portion, the balun being folded to form a plurality of layers, the combined length of the layers being approximately equal to a quarter wavelength of the signal transmitted through the RF cable.

DETAILED DESCRIPTION OF THE INVENTION

Figure 2:
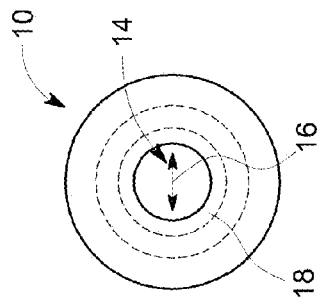
FIG. 2 is an end view of the balun assembly shown in FIG. 1.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments described herein provide a balance-unbalance (balun) assembly for reducing the currents induced into a radio-frequency (RF) coaxial cable. The balun assemblies may also be referred to herein as cable traps. For example, baluns may be used to couple balanced-to-unbalanced transmission lines. Moreover, when the baluns described herein are disposed in different locations along the transmission lines, the baluns also function as cable traps for external sheath cable eddy current connection. Accordingly, the terms balun and cable traps are used interchangeably herein.

The baluns/cable traps described herein utilize either a reduced quantity of tuning capacitors and/or no tuning capacitors. By practicing at least one embodiment, the baluns described herein may by tuned prior to being installed in the MRI system, thus reducing labor costs associated with installation and tuning. The various balun embodiments described herein may be implemented in connection with different types of magnetic resonance coils, for example surface coils, operating at different frequencies thus having different wavelengths.

Figure 1:
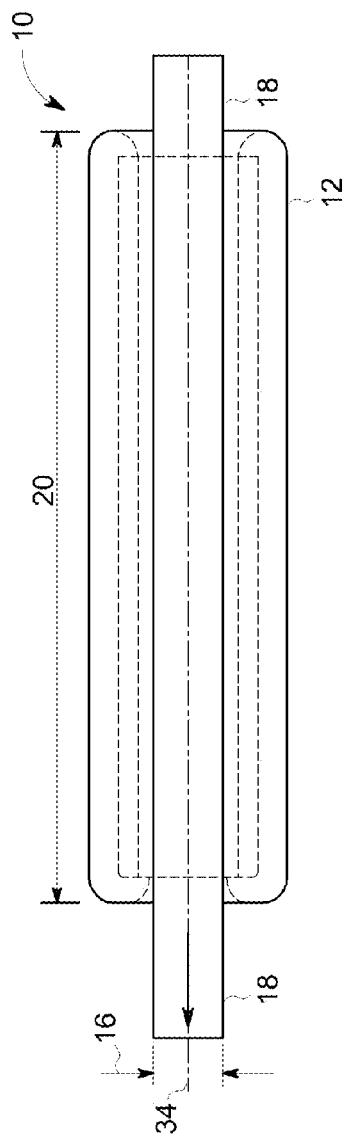
FIG. 1 is a side view of an exemplary balance-unbalance (balun) assembly formed in accordance with various embodiments.

FIG. 1 is a side view of an exemplary balun assembly 10 formed in accordance with various embodiments. FIG. 2 is an end view of the exemplary balun assembly 10 shown in FIG. 1. The balun assembly 10 includes a body portion or casing 12. The body portion 12 has an opening 14 extending therethrough. The opening 14 has an outside diameter 16 that is sized to enable at least one radio-frequency (RF) cable 18 to be inserted therethrough. For example, assuming that the outside diameter of the RF cable 18 is approximately five centimeters, the outside diameter 16 of the opening 14 is also approximately five centimeters. In the exemplary embodiment, the opening diameter 16 is sized to enable a plurality of RF cables 18 to be received therein and/or inserted therethrough. For example, assuming that the combined diameters of the plurality of RF cables 18 is approximately fifteen centimeters, the diameter 16 of the opening 14 is approximately fifteen centimeters. It should be realized that although the balun assembly 10 is described herein with respect to a single RF cable 18, the balun assembly 10, in the exemplary embodiment, is configured to circumscribe a plurality of RF cables 18.

In the exemplary embodiment, the balun assembly 10 also has a predetermined length 20. The length 20 is determined based on the wavelength of a signal transmitted through the RF cable 18. For example, assuming that the RF cable 18 transmits a signal having a wavelength of approximately 120 centimeters, the overall length 20 of the balun assembly 10 is less than approximately 30 centimeters. Determining the length 20 of the balun assembly 10 is discussed in more detail below with respect to FIG. 3. It should be realized, that the length 20 of the balun assembly 10, and the components therein, may be based on the system to which the balun assembly 10 is to be coupled. Therefore, the various physical dimensions described herein are with respect to the balun assembly 10 that is configured to be coupled to a RF cable transmitting a signal having a wavelength of approximately 120 centimeters.

Figure 3:
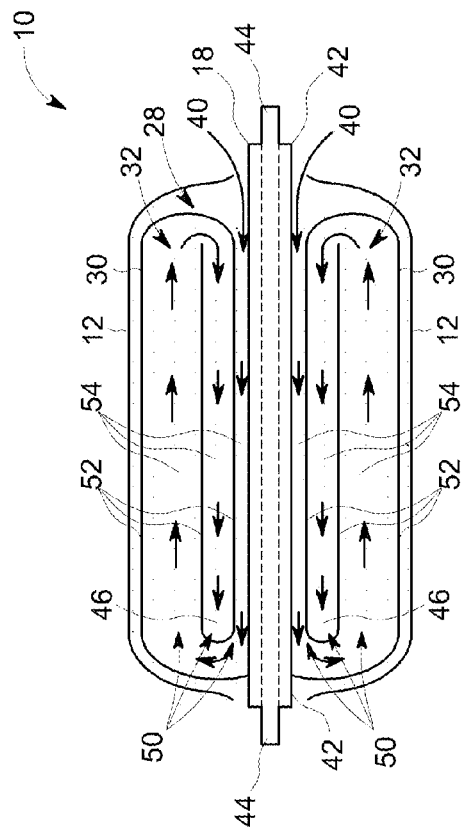
FIG. 3 is a cross-sectional view of the balun assembly shown in FIGS. 1 and 2.

FIG. 3 is a cross-sectional view of the balun assembly 10 shown in FIGS. 1 and 2. As shown in FIG. 3, the balun assembly 10 also includes a balun 28 having an electrical conductor 30 and a dielectric material 32 that at least partially surrounds the conductor 30. In the exemplary embodiment, the conductor 30 has a substantially tubular shape. The tubular shaped conductor 30 is bent or formed into a spiral about a centerline axis 34 of the opening 14 shown in FIGS. 1 and 2. In the exemplary embodiment, prior to bending, the tubular balun 28 has a length that is approximately thirty centimeters such that the balun assembly 10 may be used with the RF cable 18 described above. After bending, the tubular balun 28 has an overall length that is considerably less than thirty centimeters. For example, for an RF cable transmitting a signal having a wavelength of approximately 120 centimeters, the overall or combined length, e.g. the quarter-wavelength of the electrical conductor 30 and the dielectric material 32 is approximately 30 centimeters. However, the electrical conductor 30 and the dielectric material 32 are arranged or configured within the balun assembly 10 such that the balun has a length that is less than 30 centimeters. This folding of the balun is discussed in more detail below.

The balun 28 includes a first end 40 that is coupled to a shield 42 surrounding a conductor 44 of the RF cable 18. The balun 28 also includes a second end 46 that is also coupled to the shield 42. The balun 28 further includes the dielectric material 32 at least partially surrounding the conductor 30. As shown in FIG. 3, the conductor 30 and the dielectric material 32 are each encapsulated within the body portion 12 such that the body portion 12 has a length 20 that is less than the predetermined operating wavelength of the RF cable 18.

In the embodiment shown in FIG. 3, both the conductor 30 and the dielectric material 32 are formed into a substantially spherical shape about the centerline axis 34. In the exemplary embodiment, the conductor 30 and the dielectric material 32 are formed into a substantially spherical shape that includes a plurality of layers 50. Each layer 50 includes a portion of the balun 28, e.g. a portion 52 of the conductor 30 and a portion 54 of the dielectric material 32. For example, in the embodiment of FIG. 3, the balun assembly 10 includes three layers 50 such that a length of each of the balun layers 50 is approximately ten centimeters. Thus, the overall length 20 of the balun assembly 10 is approximately ten centimeters. It should be realized that the balun assembly 10 may include two layers 50 wherein each balun layers 50 has a length of approximately fifteen centimeters making the length 20 of the balun assembly 10 approximately fifteen centimeters. Optionally, the balun assembly 10 may include four layers 50, wherein each balun layers 50 has a length that is approximately 7.5 centimeters making the length of the balun assembly 10 approximately 7.5 centimeters. It should be realized that the balun 28 may be formed to include any quantity of balun layers 50, wherein the length of each balun layers 50 is defined by dividing the overall length of the balun 28 by the quantity of desired balun layers 50.

Figure 4:
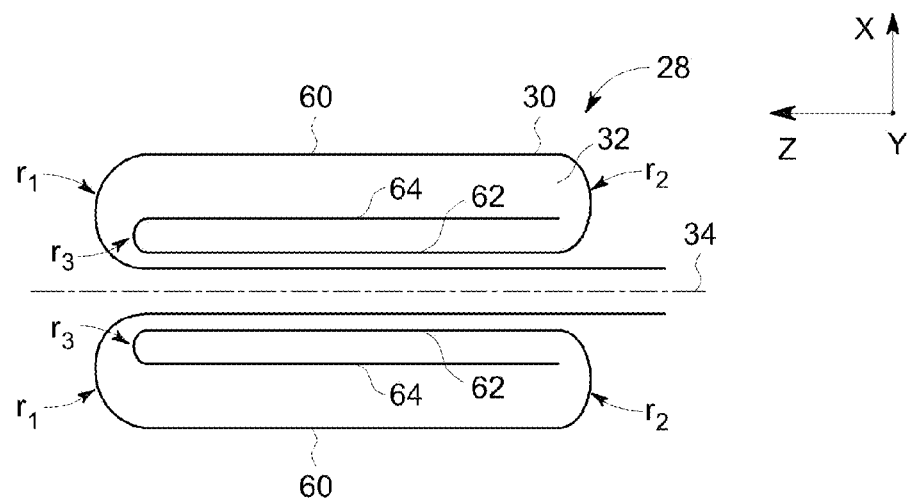
FIG. 4 is a cross-sectional view of the balun shown in FIG. 3 in accordance with an embodiment.

FIG. 4 is a cross-sectional view of the balun 28 shown in FIG. 3 that has been formed into a spherical shape about the centerline axis 34. In the exemplary embodiment, to form the spherical shape, the balun 28 is bent along three coaxial cylindrical surfaces, shown as the X-axis, the Y-axis, and the Z-axis, to form each balun layers 50. For example, to form a first balun layer 60, the balun 28 is bent along three coaxial cylindrical surfaces based on a predetermined radius of $r_1$. To form a second balun layer 62, the balun 28 is again bent along three coaxial cylindrical surfaces based on a predetermined radius of $r_2$. To form a third balun layer 64, the balun 28 is again bent along three coaxial cylindrical surfaces based on a predetermined radius of $r_3$.

In the exemplary embodiment shown in FIG. 3, the quantity of layers 50 and the radius used to form each layer 60, 62, and/or 64, e.g. $r_1$, $r_2$, and $r_3$, is selected based on the dielectric constant of the dielectric material 32 utilized within the balun 28. For example, assuming that the dielectric material 32 has a dielectric permittivity of approximately $\in = 16$, a loss tangent of $\tan \delta = 0.02$, and the wavelength of the RF cable 18 is approximately 64 MHz, the overall length 20 of the balun 28 is approximately 29.3 cm. Therefore, to make the total balun length 20 approximately 10 cm, the balun 28 is folded three times about three coaxial cylindrical surfaces. In the exemplary embodiment, based on the dielectric material described in this embodiment, the radii $r_1$, $r_2$, and $r_3$ are calculated using the formula for characteristic impedance of the RF cable 18 in accordance with:

$$Z_0 = \frac{1}{2\pi}\sqrt{\frac{\mu_0\mu}{\varepsilon_0\varepsilon}}\ln\frac{r_{i+1}}{r_i} \qquad \text{Equation 1}$$

Where $Z_0$ is the impedance of the RF cable 18;
$\mu_0$ is the electrical conductivity of the RF cable 18;
$\mu$ is the effective electrical conductivity of the RF cable 18;
$\in_0$ is the dielectric permittivity of the RF cable 18;
$\in$ is the effective dielectric constant of the RF cable 18;
$r_{i+1}$ is outer diameter of the RF cable 18; and
$r_i$ is the inner diameter of the RF cable 18.

In the exemplary embodiment, to maintain the characteristic impedance constant $Z_0$ of the RF cable 18, the ratios between the radii, $r_1$, $r_2$, and $r_3$, are defined in accordance with:

$$\frac{r_1}{r_0} = \frac{r_2}{r_1} = \frac{r_3}{r_2} = \ldots \qquad \text{Equation 2}$$

Assuming that the outer diameter $r_0$, or $r_{i+1}$ as shown in Equation 1, of the RF cable 18 is approximately 5 mm, the radii $r_1$, $r_2$, and $r_3$ and the resulting characteristic impedance $Z_0$ are calculated as:

$r_0 = 5$ mm, $r_1 = 9.8$ mm, $r_2 = 13.72$ mm, $r_3 = 26.89$ mm, $Z_0 = 5\Omega$.

Figure 5:
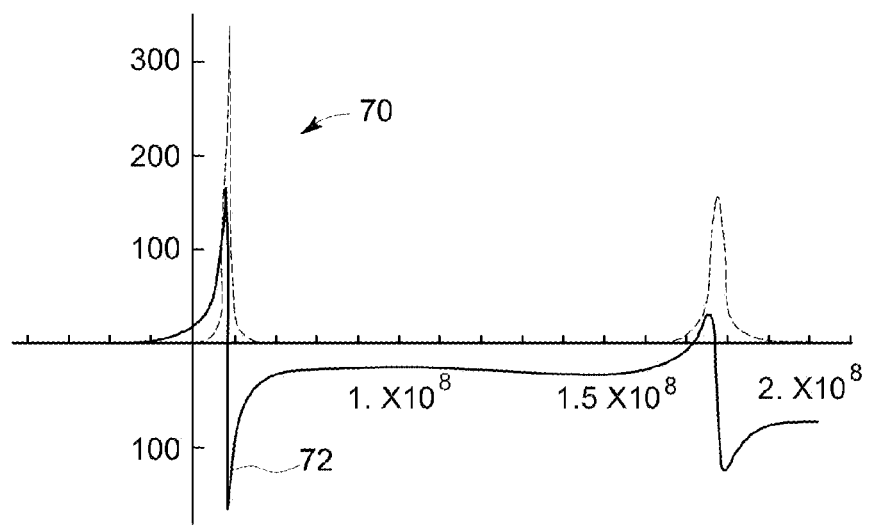
FIG. 5 is a graphical illustration of the operational characteristics of the balun assembly shown in FIG. 4.
Figure 6:
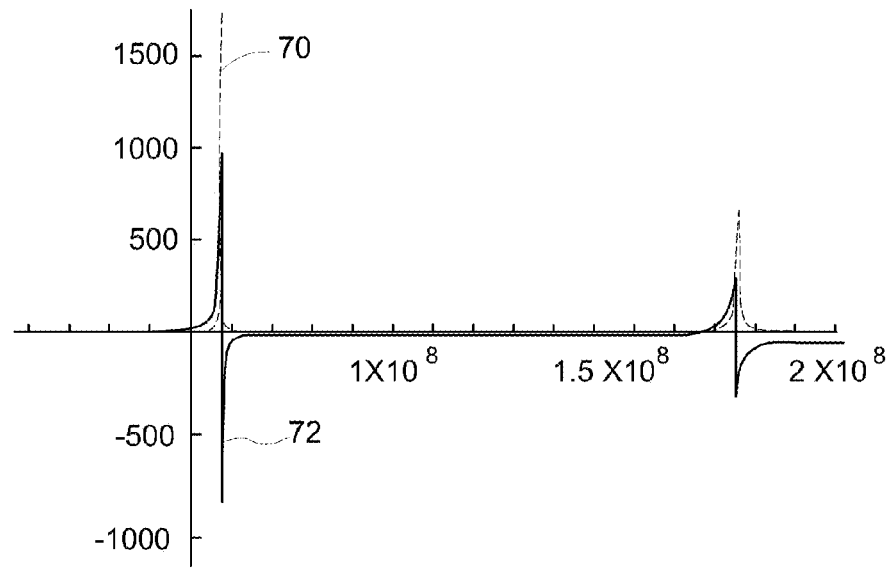
FIG. 6 is another graphical illustration of the operational characteristics of the balun assembly shown in FIG. 4.

FIGS. 5 and 6 are graphical illustrations of the operational characteristics of the balun assembly 10 described above wherein the X-axis represents the operational frequency of the balun 28 and the Y-axis represents the resistance, in ohms, of the balun 28 wherein the loss tangent is approximately 0.02. The curve 70 represents a frequency sweep of the balun 28 at a first operational frequency and curve 72 represents a frequency sweep of the balun 28 at a second different frequency. As shown in FIG. 5, utilizing a loss tangent of approximately 0.02, the impedance of interest occurs at approximately 300 Ohms. As shown in FIG. 6, when utilizing a loss tangent of approximately 0.002, the impedance of interest occurs at approximately 3000 Ohms.

Figure 7:
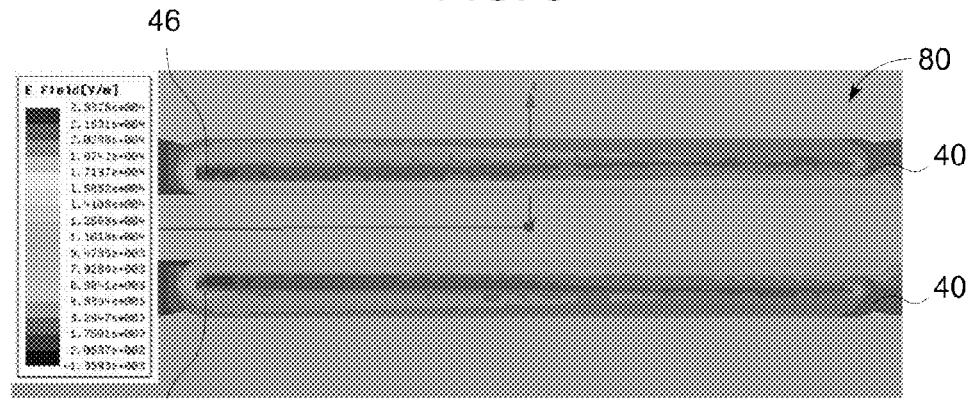
FIG. 7 is a cross-sectional view of an exemplary electric field distribution generated by the balun assembly shown in FIG. 4.
Figure 8:
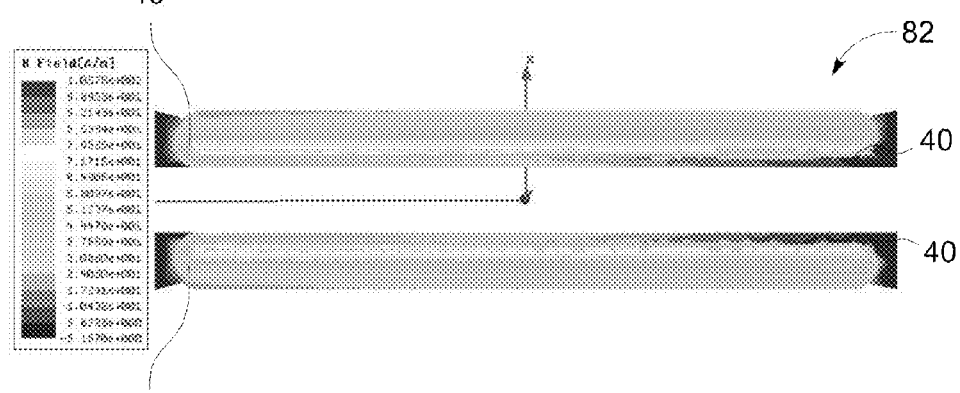
FIG. 8 is a cross-sectional view showing an exemplary magnetic field distribution generated by the balun assembly shown in FIG. 4.

FIG. 7 is a cross-sectional view of an exemplary electric field distribution 80 generated by the balun 28 during normal operation. FIG. 8 is a cross-sectional view of an exemplary magnetic field distribution 82 generated by the balun 28 during normal operation As shown in FIG. 7, the electric field inside the balun 28 also represents the voltage through the balun 28. As shown in FIG. 7, proximate to the balun first end 40, where current enters the balun 28, the voltage, represented as light shading, is relatively low. However, as the current travels through the balun 28, the electric field gradually reduces from the first end 40 to the second end 46, represented as a dark shading. More specifically, the electric field gradually decays from the first end 40 to the second end 46.

As shown in FIG. 8, the magnetic field the magnetic field, represented as light shading, is relatively low at the first end 40, thus there is relatively little current at the first end. However, the second end 46 has a significantly greater magnetic field, represented as dark shading, compared to the first end 40. Thus, the second end 46 experiences a relatively high current. Moreover, because the second end 46 is located remotely from the RF cable 18, the heat produced by the balun 28 is not transferred to the RF cable, thus maintaining the RF cable at a reduced temperature.

Figure 9:
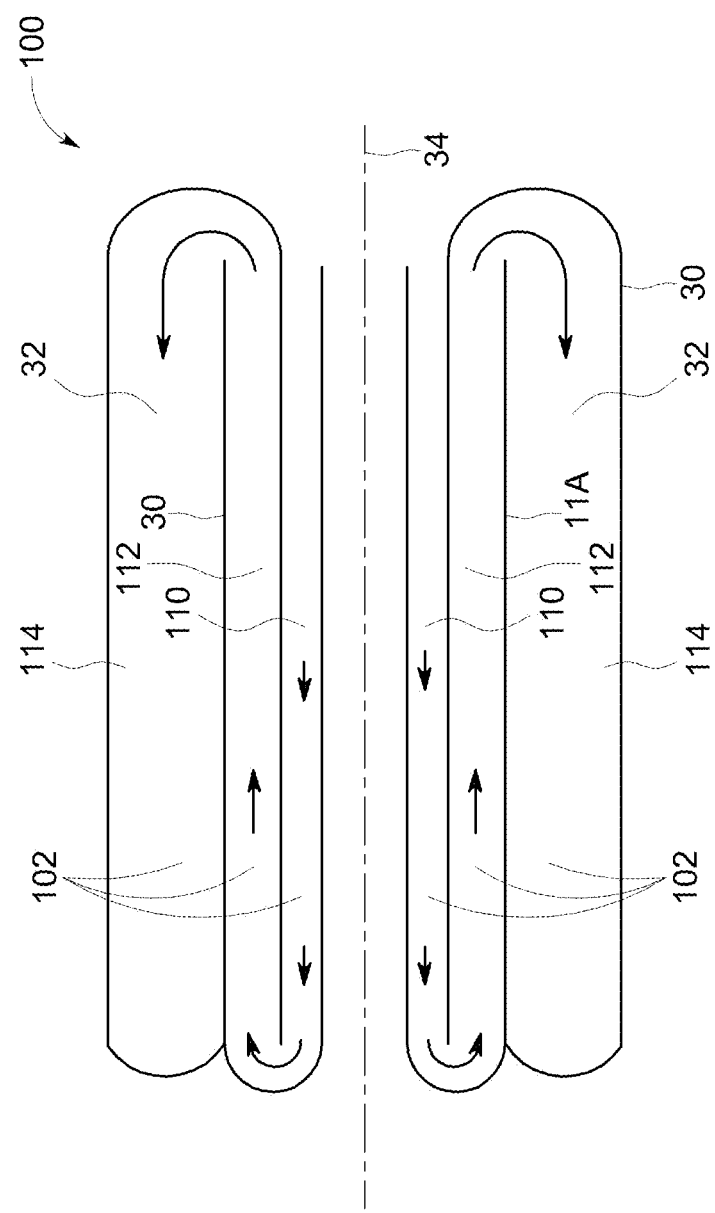
FIG. 9 is a cross-sectional view of another exemplary balun that may be used with the balun assembly shown in FIG. 1 in accordance with an embodiment.

FIG. 9 is a cross-sectional view of another exemplary balun 100 that may be used with the balun assembly 10 shown in FIG. 1. Balun 100 is substantially similar to balun 28 except that balun 100 is formed in a folded manner. More specifically, in this embodiment, a plurality of layers 102, each including a portion of the conductor 30 and the dielectric material 32, are formed into a substantially folded shape about the centerline axis 34. In the exemplary embodiment, the conductor 30 and the dielectric material 32 are folded to form a plurality of layers 102. Each layer 102 includes a portion of the balun 100. For example, in this embodiment, the balun 100 includes three layers 102 such that a length of each of each layer 102 is approximately ten centimeters. Thus, the overall length 20 of the balun 100 is approximately ten centimeters.

It should be realized that the balun 10 may include two layers 102 wherein each layer has a length of approximately fifteen centimeters making the length 20 of the balun 100 approximately fifteen centimeters. Optionally, the balun 100 may include four layers 102, wherein each layer has a length that is approximately 7.5 centimeters making the length of the balun 100 approximately 7.5 centimeters. It should be realized that the balun 100 may be formed to include any quantity of layers 102, wherein the length of each layer is defined by dividing the overall length of the balun 100 by the number of desired layers 102.

In the exemplary embodiment, the balun 100 includes a first layer 110 that is disposed radially outward from the RF cable 18, a second layer 112 that is disposed radially outward from the first layer 110, and a third layer 114 that is disposed radially outward from the second layer 112. To form the first layer 110, the balun 100 is bent along three coaxial cylindrical surfaces based on the predetermined radius of $r_1$. To form the second layer 112, the balun 100 is again bent along three coaxial cylindrical surfaces based on a predetermined radius of $r_2$. To form the third layer 114, the balun 100 is again bent along three coaxial cylindrical surfaces based on a predetermined radius of $r_3$. Similar to the balun 28 shown in FIGS. 1-4, the quantity of layers 102 and the radius used to form each layer 102, e.g. $r_1$, $r_2$, and $r_3$ is selected based on the dielectric constant of the dielectric material 32 utilized within the balun 100 using Equations 1 and 2 described above. During operation, current travels through the conductor from the radially inner layer 110 of the balun 100, through the middle layer 112, and exits the balun 100 through the outermost third layer 114.

Figure 10:
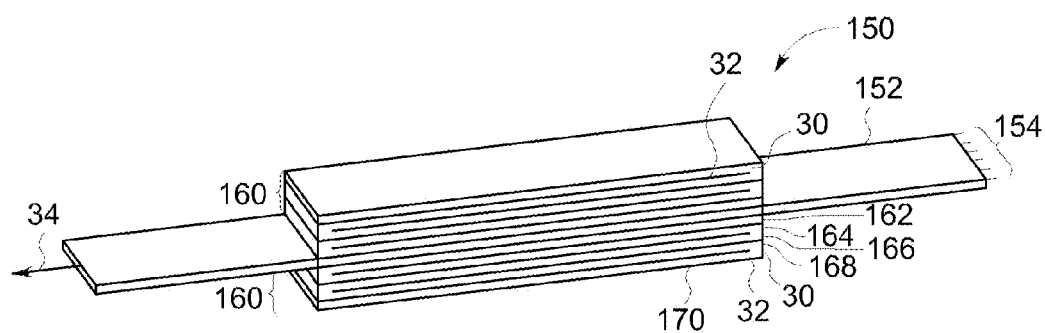
FIG. 10 is a cross-sectional view of another exemplary balun that may be used with the balun assembly shown in FIG. 1 in accordance with an embodiment.

FIG. 10 is a cross-sectional view of another exemplary balun 150 that may be used with the balun assembly 10 shown in FIG. 1. Balun 150 has a substantially rectangular cross-sectional profile. More specifically, the balun 150 is configured to be utilized with a printed-circuit board style RF cable 152, which is a different version of the RF cable 18 shown in FIG. 1. For example, the PCB RF cable 152 may be a stripline or microstrip style RF cable having a substantially rectangular cross-sectional profile. The PCB RF cable 152 includes a plurality of RF communication channels 154 extending therethrough.

The balun 150 is folded to include a plurality of balun layers 160 each having a substantially rectangular cross-sectional profile. In the exemplary embodiment, the combined length of the plurality of layers 160 is substantially equal to a quarter-wave length of the signal transmitted though the RF cable 152. In this embodiment, the balun 150 includes both the conductor 30 and the dielectric material 32 that are formed into a substantially folded shape about the centerline axis 34. In the exemplary embodiment, the conductor 30 and the dielectric material 32 are folded to form the plurality of layers 160. For example, in this embodiment, the balun 150 includes 5 layers 160 such that a length of each of each layer 160 is approximately six centimeters. Thus, the overall length of the balun 150 is approximately six centimeters.

In the exemplary embodiment, the balun 150 includes a first layer 162 that is disposed radially outward from the RF cable 152, a second layer 164 that is disposed radially outward from the first layer 162, a third layer 166 that is disposed radially outward from the second layer 164, a fourth layer 168 that is disposed radially outward from the third layer 166, and a fifth layer 170 that is disposed radially outward from the fourth layer 168. Similar to the baluns 28 and 100 described above, the quantity of layers and the radius used to form each layer, e.g. $r_1$, $r_2$, $r_3$, etc. is selected based on the dielectric constant of the dielectric material 32 utilized within the balun 150 using Equations 1 and 2 described above. Similar to the balun 100 described above, during operation, current enters the balun 150 from the radially inner layer 162, travels through the middle layers 164, 166, and 168, respectively, and exits the balun 150 through the outermost fifth layer 170.

Figure 11:
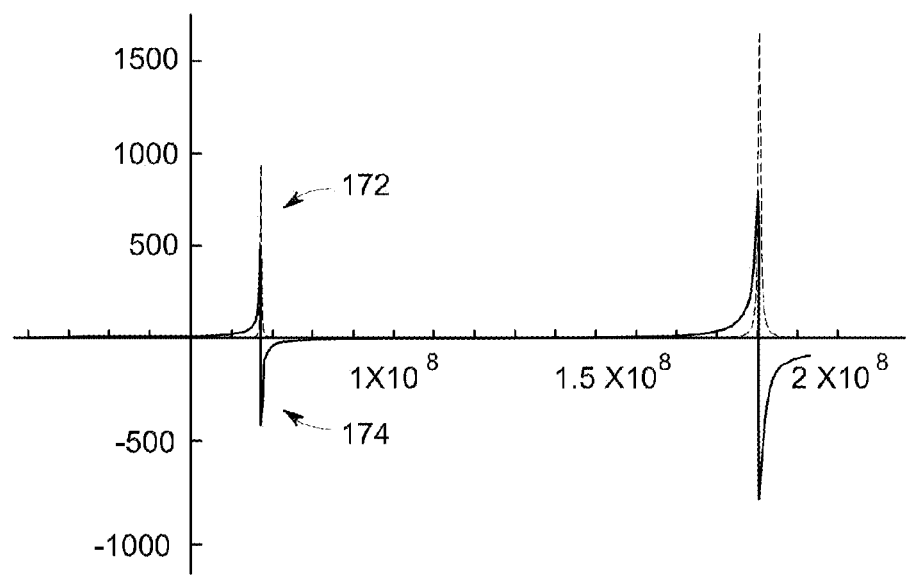
FIG. 11 is a graphical illustration of the operational characteristics of the balun shown in FIG. 10.

FIG. 11 is a graphical illustration of the operational characteristics of the balun 150 wherein the X-axis represents the operational frequency of the balun assembly and the Y-axis represents the resistance, in ohms, of the balun 150, wherein the loss tangent is approximately 0.002 and the dielectric constant of the dielectric material 32 is approximately 7. The curve 172 represents a frequency sweep of the balun 150 at a first operational frequency and line curve represents a frequency sweep of the balun 150 at a second different frequency. As shown in FIG. 11, utilizing a loss tangent of approximately 0.002, the impedance of interest occurs at approximately 700 Ohms.

Figure 12:
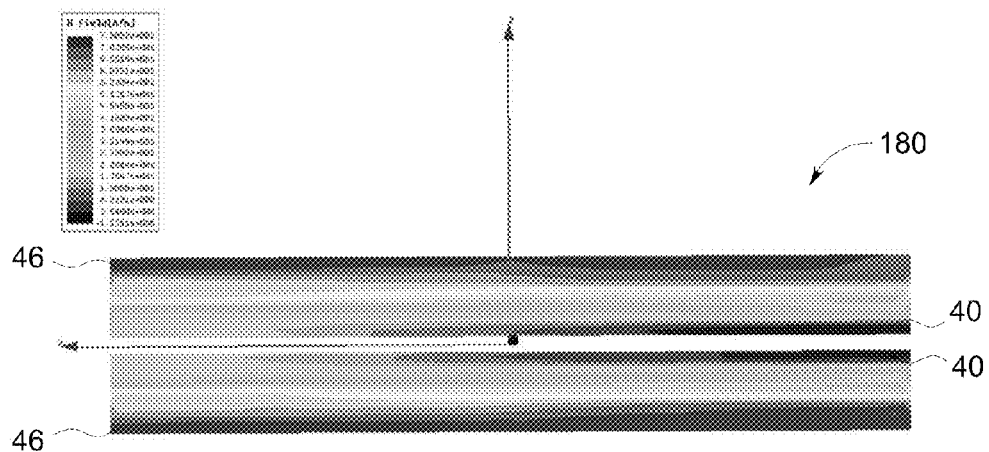
FIG. 12 is a cross-sectional view showing an exemplary electric field distribution generated by the balun shown in FIG. 10.
Figure 13:
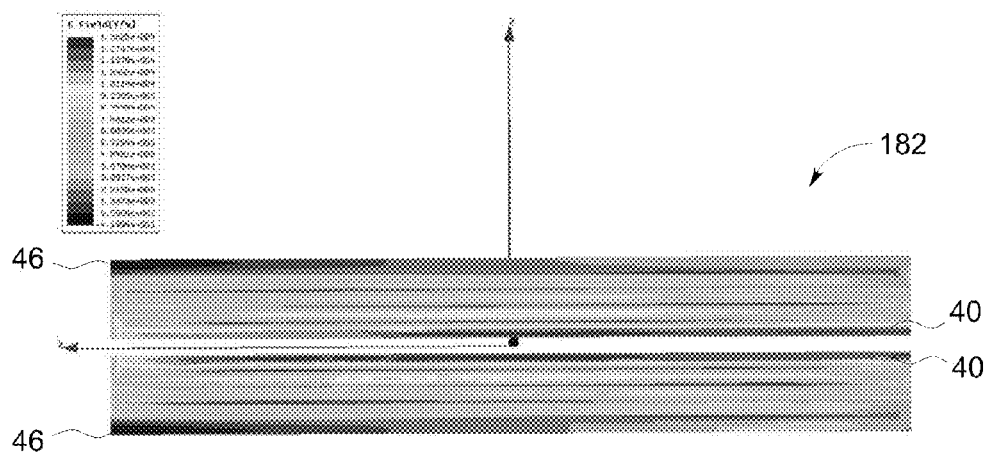
FIG. 13 is a cross-sectional view showing an exemplary magnetic field distribution generated by the balun shown in FIG. 10.

FIG. 12 illustrates is a cross-sectional view of an exemplary electric field distribution 180 generated by the balun 150 during normal operation. FIG. 13 illustrates is a cross-sectional view of an exemplary magnetic field distribution 182 generated by the balun 150 during normal operation As shown in FIG. 12, the electric field inside the balun assembly also represents the voltage through the balun assembly. As shown in FIG. 12, proximate to the balun first end 40, where current enters the balun, the voltage is relatively low. However, as the current travels through the balun 150, the electric field gradually reduces from the first end 40 to the second end 46. More specifically, the electric field gradually decays from the first end 40 to the second end 46.

As shown in FIG. 13, the magnetic field the magnetic field is relatively low at the first end 40, thus there is relatively little current at the first end. However, the second end 46 has a significantly greater magnetic field compared to the first end 40. Thus, the second end experiences a relatively high current. Moreover, because the second end 46 is located remotely from the RF cable 152, the heat produced by the balun 150 is not transferred to the RF cable 152, thus maintaining the RF cable 152 at a reduced temperature.

Figure 14:
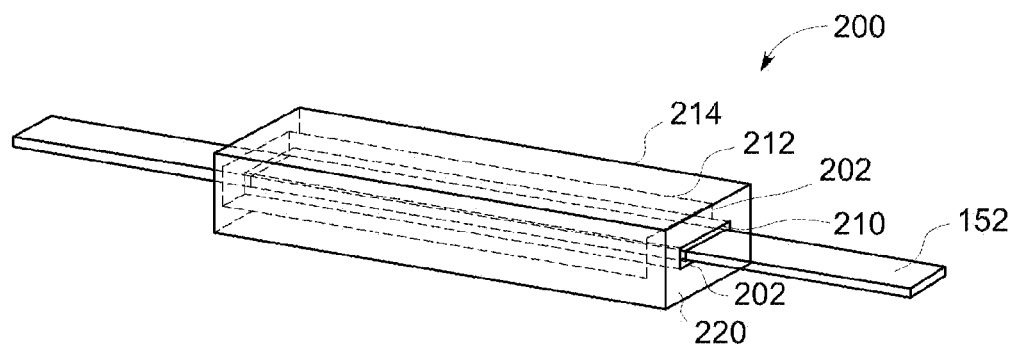
FIG. 14 is a cross-sectional view of another exemplary balun that may be used with the balun assembly shown in FIG. 1 in accordance with an embodiment.
Figure 15:
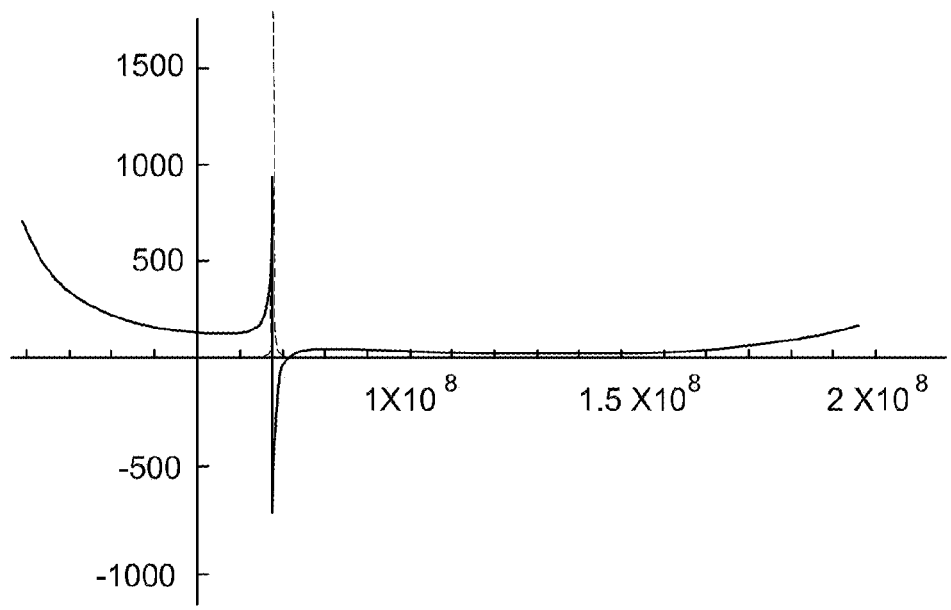
FIG. 15 is a graphical illustration of the operational characteristics of the balun shown in FIG. 14.

FIG. 14 is a cross-sectional view of another exemplary balun 200 that may be used with the balun assembly 10 shown in FIG. 1. Balun 200 is substantially similar to balun 150 shown in FIG. 1. In this embodiment, balun 200 also includes a plurality of balun layers 202 each having a substantially rectangular cross-sectional profile. In the exemplary embodiment, the combined length of the plurality of layers 202 is substantially equal to a quarter-wave length of the signal transmitted though the RF cable 152. In this embodiment, the balun 250 includes 3 layers 202 such that a length of each of each layer 202 is approximately ten centimeters. Thus, the overall length of the balun 250 is approximately ten centimeters.

In the exemplary embodiment, the balun 250 includes a first layer 210 that is disposed radially outward from the RF cable 152, a second layer 212 that is disposed radially outward from the first layer 210, and a third layer 214 that is disposed radially outward from the second layer 212. In this embodiment, each of the layers 202 are fabricated using a metallic material and have a substantially rectangular cross-sectional profile. Moreover, each layer 202 is separated from each other layer 202 by an airgap 220. In the exemplary embodiment, the size of the layers 202 are determined in accordance with:

$$\frac{w_1}{w_0} = \frac{w_2}{w_1} = \frac{w_3}{w_2} = \ldots \qquad \text{Equation 3}$$

where $w_0$ is width of the RF cable 152;
$w_1$ is the width of the first layer 210;
$w_2$ is the width of the first layer 210; and
$w_3$ is the width of the first layer 210.

Similar to the balun 150 described above, the quantity of layers 202 and the size of each layer 202 is selected based on the dielectric constant of the dielectric material 32 utilized within the balun 150 using Equations 1 and 2 described above.

The height of distance of each layer from the RF cable 152 is defined in accordance with:

$$\frac{h_1}{h_0} = \frac{h_2}{h_1} = \frac{h_3}{h_2} = \ldots \qquad \text{Equation 4}$$

where $h_0$ is the centerline of the RF cable 152;

$h_1$ is the distance of the first metallic layer 210 from the RF cable 152;

$h_2$ is the distance of the second metallic layer 212 from the first metallic layer 210; and $h_3$ is the distance of the third metallic layer 214 from the second metallic layer 212.

During operation, the balun 200, including the metallic layers 202 described above, achieves high impedance at the frequency of interest. For example, FIG. 12 is a graphical illustration of the operational characteristics of the balun 200 wherein the X-axis represents the operational frequency of the balun assembly and the Y-axis represents the resistance, in ohms, of the balun 200, wherein the loss tangent is selected to be approximately 0.0023 and the dielectric constant is selected to be approximately 10.2. The curve 230 represents a frequency sweep of the balun 200 at a first operational frequency and curve 232 represents a frequency sweep of the balun 200 at a second different frequency. As shown in FIG. 11 utilizing a loss tangent of approximately 0.0023, the impedance of interest occurs at approximately 1500 Ohms.

Figure 16:
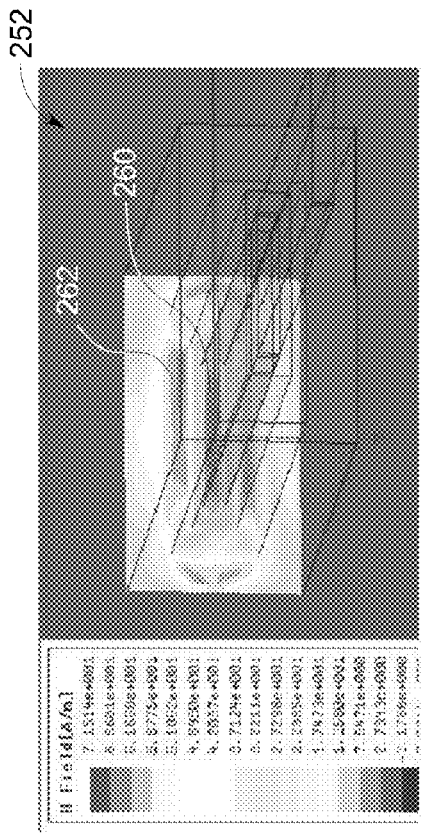
FIG. 16 is an end view of an exemplary magnetic field distribution generated by the balun shown in FIG. 14.
Figure 17:
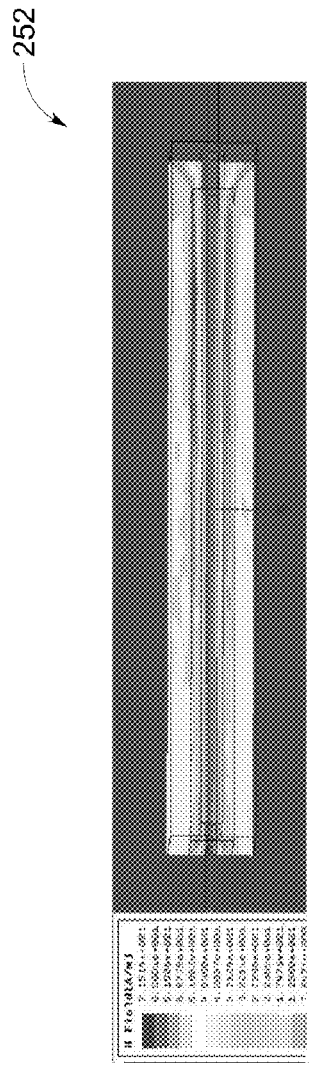
FIG. 17 is a cross-sectional view of the exemplary magnetic field distribution generated by the balun shown in FIG. 14.

FIG. 16 illustrates is an end view of an exemplary magnetic field distribution 252 generated by the balun 200 during normal operation. FIG. 17 illustrates is a cross-sectional view of the exemplary magnetic field distribution 252 shown in FIG. 16. As shown in FIGS. 16 and 17, the magnetic field is relatively low at the first end 260, thus there is relatively little current at the first end. However, the second end 262 has a significantly greater magnetic field compared to the first end 260. Thus, the second end 262 experiences a relatively high current. Moreover, because the second end 262 is located remotely from the RF cable 152, the heat produced by the balun 200 is not transferred to the RF cable 152, thus maintaining the RF cable 152 at a reduced temperature. Described herein are various embodiments of baluns that each create high impedance on the RF cable.

Figure 18:
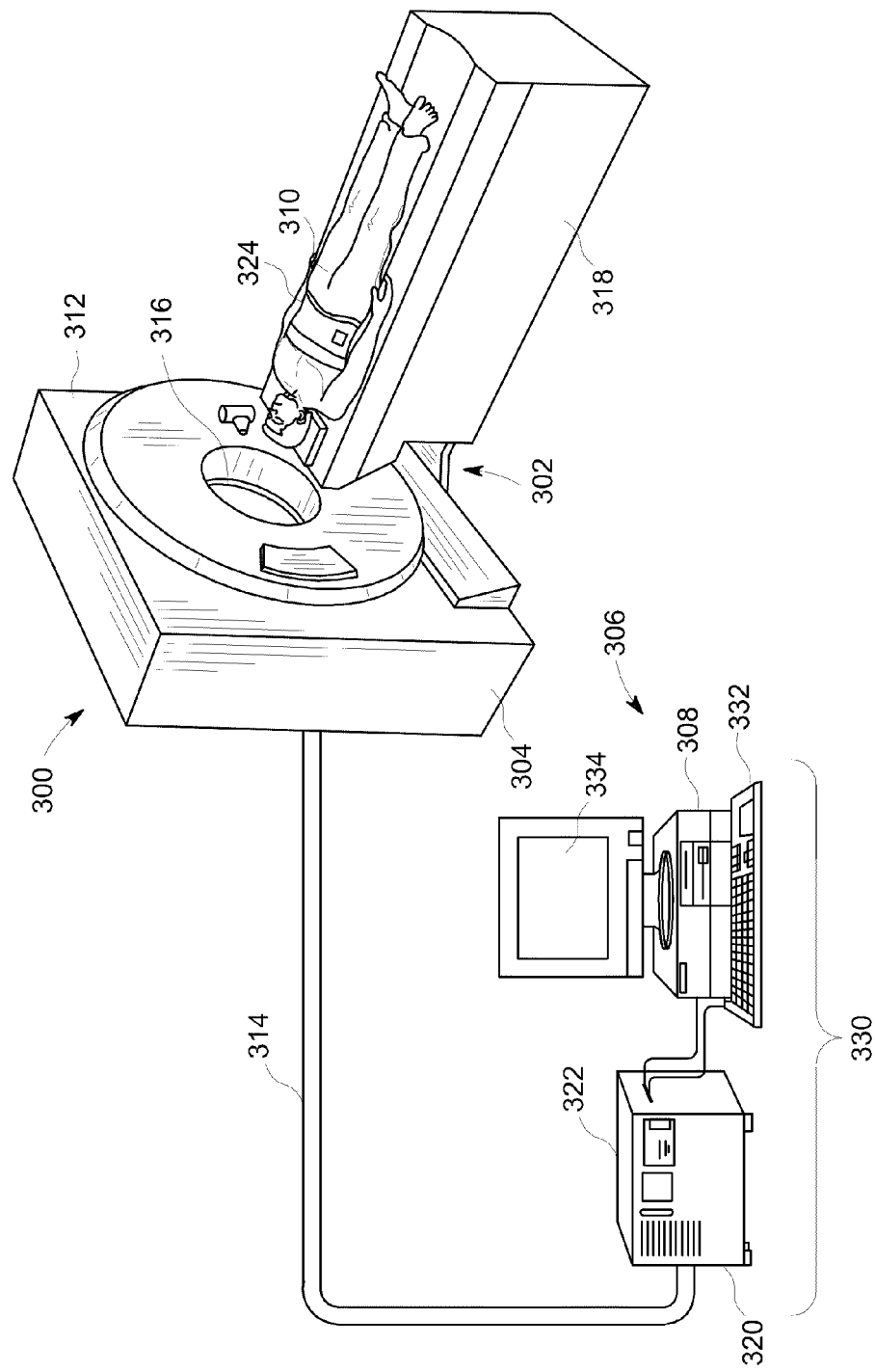
FIG. 18 is a pictorial view of an exemplary medical imaging system that may be utilized with the baluns formed in accordance with various embodiments.

Various embodiments of the baluns described herein may be provided as part of, or used with, a medical imaging system, such as imaging system 300 as shown in FIG. 18. It should be appreciated that although the imaging system 300 is illustrated as a single modality imaging system, the various embodiments may be implemented in or with multi-modality imaging systems. The imaging system 300 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Referring to FIG. 18, the imaging system 300 includes an imaging portion 302 having an imaging unit 304 (e.g., imaging scanner) and a processing portion 306 that may include a processor 308 or other computing or controller device. In particular, the imaging unit 304 enables the imaging system 300 to scan an object or patient 310 to acquire image data, which may be image data of all or a portion of the object or patient 310. The imaging unit 304 includes a gantry 312 having one or more imaging components (e.g., magnets or magnet windings within the gantry 312) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 306 via a communication link 314 that may be wired or wireless. During an imaging scan by the imaging unit 304, the gantry 312 and the imaging components mounted thereon or therein may remain stationary or rotate about or along a center of rotation defining an examination axis through a bore 316. The patient 310 may be positioned within the gantry 312 using, for example, a motorized table 318.

In operation, an output of one or more of the imaging components is transmitted to the processing portion 306, and vice versa, which may include transmitting signals to or from the processor 308 through a control interface 320. The processor 308 also may generate control signals for controlling the position of the motorized table 318 or imaging components based on user inputs or a predetermined scan. During a scan, image data, such as magnetic resonance image data from the imaging components may be communicated to the processor 308 through a data interface 322 via the control interface 320, for example, as acquired by the surface coil 324, illustrated as a torso surface coil array in FIG. 18.

The processor 308 and associated hardware and software used to acquire and process data may be collectively referred to as a workstation 330. The workstation 330 includes a keyboard 332 and/or other input devices such as a mouse, a pointer, and the like, and a monitor 334. The monitor 334 displays image data and may accept input from a user if a touchscreen is available.

Figure 19:
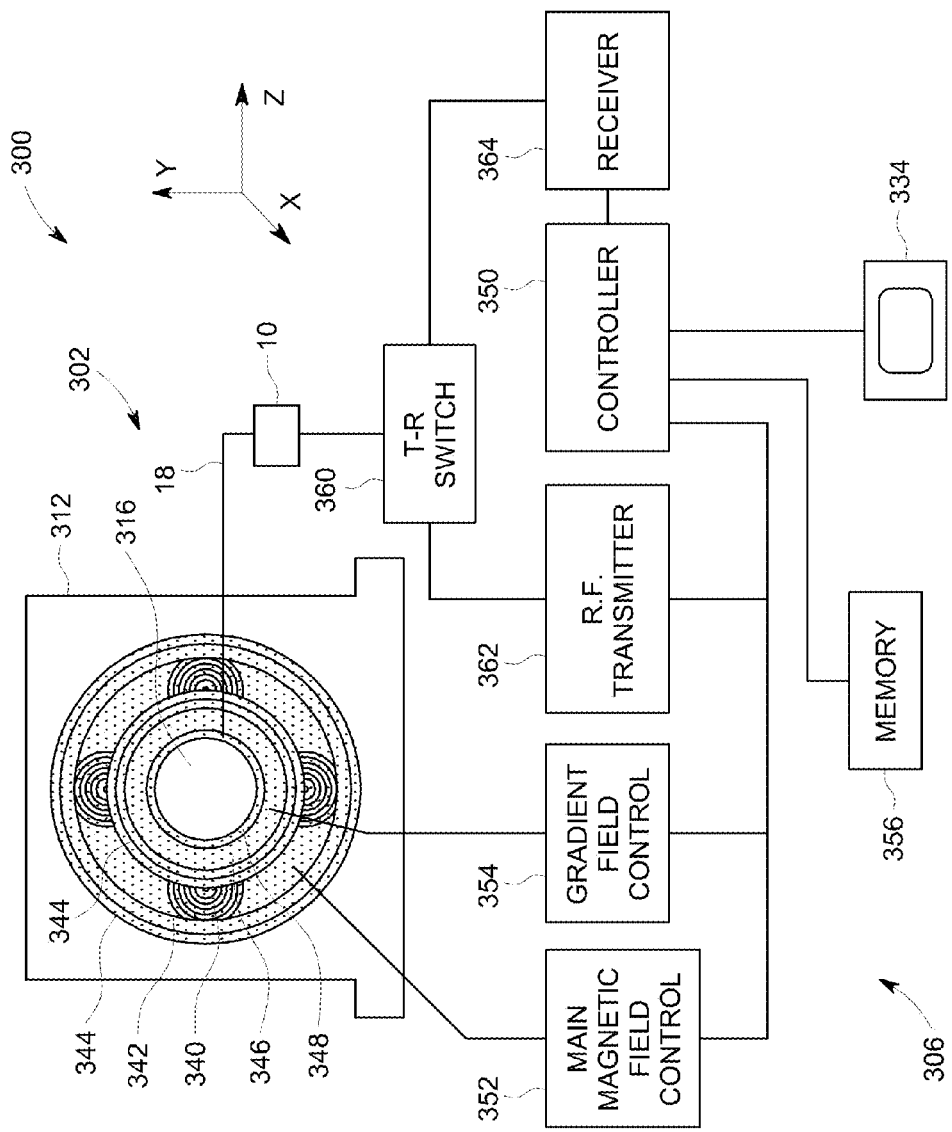
FIG. 19 is a simplified schematic illustration of the medical imaging system shown in FIG. 18.

FIG. 19 is a schematic illustration of the imaging system 300 shown in FIG. 18. In the exemplary embodiment, the imaging system 300 also includes a superconducting magnet 340 formed from magnetic coils supported on a magnet coil support structure. However, in other embodiments, different types of magnets may be used, such as permanent magnets or electromagnets. A vessel 342 (also referred to as a cryostat) surrounds the superconducting magnet 340 and is filled with liquid helium to cool the coils of the superconducting magnet 340. A thermal insulation 344 is provided surrounding the outer surface of the vessel 342 and the inner surface of the superconducting magnet 340. A plurality of magnetic gradient coils 346 are provided within the superconducting magnet 340 and an RF transmit coil 348 is provided within the plurality of magnetic gradient coils 346. In some embodiments the RF transmit coil 348 may be replaced with a transmit and receive coil as described in more detail herein. The components within the gantry 312 generally form the imaging portion 302. It should be noted that although the superconducting magnet 340 is a cylindrical shaped, other shapes of magnets can be used.

The processing portion 306 also generally includes a controller 350, a main magnetic field control 352, a gradient field control 354, a memory 356, the display device 334, a transmit-receive (T-R) switch 360, an RF transmitter 362 and a receiver 364.

In operation, a body of an object, such as the patient 310 (shown in FIG. 14) or a phantom to be imaged, is placed in the bore 316 on a suitable support, for example, the motorized table 318 (shown in FIG. 14) or other patient table. The superconducting magnet 340 produces a uniform and static main magnetic field $B_o$ across the bore 316. The strength of the electromagnetic field in the bore 316 and correspondingly in the patient 310, is controlled by the controller 350 via the main magnetic field control 352, which also controls a supply of energizing current to the superconducting magnet 340.

The magnetic gradient coils 346, which include one or more gradient coil elements, are provided so that a magnetic gradient can be imposed on the magnetic field $B_o$ in the bore 316 within the superconducting magnet 340 in any one or more of three orthogonal directions x, y, and z. The magnetic gradient coils 346 are energized by the gradient field control 354 and are also controlled by the controller 350.

The RF transmit coil 348, which may include a plurality of coils (e.g., resonant surface coils), is arranged to transmit magnetic pulses and/or optionally simultaneously detect MR signals from the patient 310 if receive coil elements are also provided, such as the surface coil 324 (shown in FIG. 14) configured as an RF receive coil. The RF transmit coil 348 and the receive surface coil 324 are selectably interconnected to one of the RF transmitter 362 or receiver 364, respectively, by the T-R switch 360. The RF transmitter 362 and T-R switch 360 are controlled by the controller 350 such that RF field pulses or signals are generated by the RF transmitter 362 and selectively applied to the patient 310 for excitation of magnetic resonance in the patient 310. In the exemplary embodiment, any of the baluns described herein, e.g. balun assembly 10 may be installed to circumscribe the RF cable 18 that couples the RF transmit coil 348 to the T-R switch 360.

Following application of the RF pulses, the T-R switch 360 is again actuated to decouple the RF transmit coil 348 from the RF transmitter 362. The detected MR signals are in turn communicated to the controller 350. The controller 350 includes a processor (e.g., image reconstruction processor), for example, the processor 308 (shown in FIG. 14), that controls the processing of the MR signals to produce signals representative of an image of the patient 310.

The processed signals representative of the image are also transmitted to the display device 334 to provide a visual display of the image. Specifically, the MR signals fill or form a k-space that is Fourier transformed to obtain a viewable image. The processed signals representative of the image are then transmitted to the display device 86.

In various embodiments, the RF transmitter 362 is configured to generate at least two resonate frequencies, for example, centered about the Larmor frequencies of carbon (e.g., $^{13}C$ nuclei) and proton (hydrogen nuclei). However, it should be noted that the RF transmitter 362 may be configured to generate other frequencies causing different nuclei to resonate at their Larmor frequencies. Moreover, the MR signals and the image(s) generated may be encoded using any known technique in the art. In the exemplary embodiment, the baluns described herein may be coupled between the RF transmit coil 348 and the T-R switch 360.

A technical effect of the baluns described herein is to provide a balun that may be utilized with an MRI imaging system. The baluns described herein may be utilized with a plurality of RF cables. Specifically, the baluns described herein are quarter wave baluns that may be used with systems operating at relatively low frequencies without adding length to the transmission line. Moreover, the baluns do not utilize tuning capacitors. As such, the baluns described herein may be tuned prior to the baluns being installed in the MRI imaging system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A balun assembly comprising:
a casing having an opening extending therethrough, the opening sized to receive at least one radio-frequency (RF) cable therethrough, the RF cable transmitting therethrough a signal having a wavelength; and
a balun disposed within the casing and positioned to circumscribe the RF cable extending through the opening, the balun being folded to form a plurality of layers, the combined length of the layers being approximately equal to a quarter wavelength of the signal transmitted through the RF cable.

2. A balun assembly in accordance with claim 1 wherein the RF cable comprises a Printed Circuit Board (PCB) RF cable having a plurality of channels, the balun comprising a plurality of folded rectangular layers disposed adjacent to the PCB RF cable.

3. A balun assembly in accordance with claim 1 wherein the balun includes a dielectric material and a cylindrical electrical conductor folded in three-dimensions.

4. A balun assembly in accordance with claim 3 wherein the balun includes a dielectric material and a cylindrical electrical conductor folded in three-dimensions, the cylindrical electrical conductor and the dielectric material being spiral wound within the casing.

5. A balun assembly in accordance with claim 1 wherein the balun includes a dielectric material and a cylindrical electrical conductor folded in three-dimensions, the cylindrical electrical conductor and the dielectric material being spiral wound within the casing to form a first layer, a second layer disposed radially outward from the first layer, and a third layer disposed radially outward from the second layer, the first layer configured as an electrical input, the second layer configured as an electrical output.

6. A balun assembly in accordance with claim 1 wherein the balun includes a dielectric material and a cylindrical electrical conductor folded in three-dimensions, the cylindrical electrical conductor and the dielectric material being arranged in a folded manner within the casing.

7. A balun assembly in accordance with claim 1 wherein the cylindrical electrical conductor and the dielectric material are arranged in a folded manner within the casing to form a first layer, a second layer disposed radially outward from the first layer, and a third layer disposed radially outward from the second layer, the first layer configured as an electrical input, the third layer configured as an electrical output.

8. A balun assembly in accordance with claim 1 wherein the balun includes a dielectric material and a cylindrical electrical conductor folded in three-dimensions, the dielectric material having a dielectric permittivity, the electrical conductor being folded based on the dielectric permittivity.

9. A balun assembly in accordance with claim 1 wherein the balun includes a dielectric material and a cylindrical electrical conductor folded in three-dimensions, the dielectric material having a dielectric permittivity, the electrical conductor being folded to include a plurality of radii, the radii based on the dielectric permittivity.

10. A balun assembly in accordance with claim 1 wherein the balun includes a dielectric material and a cylindrical electrical conductor folded in three-dimensions, the dielectric material having a dielectric permittivity, the electrical conductor being folded to include a plurality of different radii, the radii including a first radius and a second radius that is different than the first radius.

11. A balun assembly in accordance with claim 1 wherein the balun includes a dielectric material and a cylindrical electrical conductor folded in three-dimensions, the dielectric material having a dielectric permittivity, the electrical conductor being folded include a plurality of radii, at least one of the radii being based on the outer diameter of the RF cable.

12. A balun assembly in accordance with claim 1 wherein the balun includes a dielectric material and a cylindrical electrical conductor folded in three-dimensions, the dielectric material having a dielectric permittivity, the electrical conductor being folded to include a first balun portion and a second balun portion, the first and second balun portions each being formed to have a different radii.

13. A balun assembly in accordance with claim 1 further comprising a plurality of metallic shields circumscribing the balun.

14. A method of providing a balun for a Magnetic Resonance Imaging (MRI) system including at least one radio-frequency (RF) cable operating at a predetermined wavelength, said method comprising:
determining a length of a length of the balun based on the wavelength of a signal transmitted through the RF cable; and
folding the balun into a plurality of layers such that an overall length of the balun is less than a quarter wavelength of a signal transmitted through the RF cable, the length of each layer being determined based on the quantity of layers.

15. A method in accordance with claim 14 wherein the balun includes a cylindrical electrical conductor folded in three-dimensions, said method further comprising folding the balun into a spiral wound arrangement.

16. A method in accordance with claim 14 wherein the balun includes a cylindrical electrical conductor folded in three-dimensions, said method further comprising folding the balun to include
a first layer;
a second layer disposed radially outward from the first layer; and
a third layer disposed radially outward from the second layer, the first layer configured as an electrical input, the second layer configured as an electrical output.

17. A method in accordance with claim 14 wherein the balun includes a cylindrical electrical conductor folded in three-dimensions, said method further comprising folding the balun into a layered arrangement.

18. A method in accordance with claim 14 wherein the balun includes a cylindrical electrical conductor folded in three-dimensions, said method further comprising folding the balun to include
a first layer;
a second layer disposed radially outward from the first layer; and
a third layer disposed radially outward from the second layer, the first layer configured as an electrical input, the third layer configured as an electrical output.

19. A method in accordance with claim 14 further comprising folding the balun into a plurality of layers such that an overall length of the balun is less than a quarter wavelength of a signal transmitted through the RF cable, the length of each layer being determined based on a dielectric permittivity of the balun.

20. A Magnetic Resonance Imaging (MRI) system comprising:
a radio frequency (RF) transmit coil;
a transmit-receive (T-R) switch;
an RF cable coupled between the RF transmit coil and the T-R switch; and
a balun assembly circumscribing the RF cable, the balun including
a casing having an opening extending therethrough, the opening sized to receive the RF, the RF cable transmitting therethrough a signal having a wavelength; and
a balun disposed within the casing, the balun being folded to form a plurality of layers, the combined length of the layers being approximately equal to a quarter wavelength of the signal transmitted through the RF cable.

* * * * *